US007244654B2

(12) United States Patent
Chidambaram et al.

(10) Patent No.: US 7,244,654 B2
(45) Date of Patent: Jul. 17, 2007

(54) DRIVE CURRENT IMPROVEMENT FROM RECESSED SIGE INCORPORATION CLOSE TO GATE

(75) Inventors: Pr Chidambaram, Richardson, TX (US); Douglas T. Grider, McKinney, TX (US); Brian A. Smith, Plano, TX (US); Haowen Bu, Plano, TX (US); Lindsey Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 116 days.

(21) Appl. No.: 10/901,568

(22) Filed: Jul. 29, 2004

(65) Prior Publication Data

US 2005/0139872 A1 Jun. 30, 2005

Related U.S. Application Data

(60) Provisional application No. 60/533,625, filed on Dec. 31, 2003.

(51) Int. Cl.
   *H01L 21/336* (2006.01)
(52) U.S. Cl. ............... 438/300; 438/305; 257/616; 257/E21.092
(58) Field of Classification Search ............. 257/616; 438/300–307, 493–509
   See application file for complete search history.

(56) References Cited

U.S. PATENT DOCUMENTS

| 5,395,777 | A | * | 3/1995 | Yang | 438/274 |
| 6,071,783 | A | * | 6/2000 | Liang et al. | 438/301 |
| 6,159,815 | A | * | 12/2000 | Lustig et al. | 438/305 |
| 6,165,826 | A | * | 12/2000 | Chau et al. | 438/231 |
| 6,214,679 | B1 | * | 4/2001 | Murthy et al. | 438/299 |
| 6,358,806 | B1 | | 3/2002 | Puchner | |
| 6,368,931 | B1 | | 4/2002 | Kuhn et al. | |
| 6,492,216 | B1 | | 12/2002 | Yeo et al. | |
| 6,563,152 | B2 | | 5/2003 | Roberds et al. | |

(Continued)

FOREIGN PATENT DOCUMENTS

WO    WO 200030169 A1 * 5/2000

OTHER PUBLICATIONS

"High Concentration Diffusivity and Clustering of Arsenic and Phosphorus in Silicon", S. Solmi and D. Nobili, Journal of Applied Physics, vol. 83, No. 5, Mar. 1, 1998, pp. 2484-2490.

(Continued)

Primary Examiner—B. William Baumeister
Assistant Examiner—Matthew W. Such
(74) Attorney, Agent, or Firm—Peter K. McLarty; W. James Brady, III; Frederick J. Telecky, Jr.

(57) ABSTRACT

A method (100) of forming a transistor includes forming a gate structure (106, 108) over a semiconductor body and forming recesses (112) substantially aligned to the gate structure in the semiconductor body. Silicon germanium is then epitaxially grown (114) in the recesses, followed by forming sidewall spacers (118) over lateral edges of the gate structure. The method continues by implanting source and drain regions in the semiconductor body (120) after forming the sidewall spacers. The silicon germanium formed in the recesses resides close to the transistor channel and serves to provide a compressive stress to the channel, thereby facilitating improved carrier mobility in PMOS type transistor devices.

20 Claims, 12 Drawing Sheets

U.S. PATENT DOCUMENTS

| | | | |
|---|---|---|---|
| 6,583,015 B2 | 6/2003 | Fitzgerald et al. | |
| 6,621,131 B2 | 9/2003 | Murthy et al. | |
| 6,638,802 B1 | 10/2003 | Hwang et al. | |
| 6,812,103 B2* | 11/2004 | Wang et al. | 438/300 |
| 7,045,407 B2* | 5/2006 | Keating et al. | 438/198 |
| 7,060,579 B2* | 6/2006 | Chidambaram et al. | 438/303 |
| 2003/0234422 A1* | 12/2003 | Wang et al. | 257/336 |
| 2004/0007715 A1 | 1/2004 | Webb et al. | |
| 2004/0173815 A1* | 9/2004 | Yeo et al. | 257/192 |
| 2005/0098854 A1* | 5/2005 | Shima | 257/616 |
| 2005/0148147 A1* | 7/2005 | Keating et al. | 438/299 |
| 2006/0009001 A1* | 1/2006 | Huang et al. | 438/305 |
| 2006/0051922 A1* | 3/2006 | Huang et al. | 438/282 |
| 2006/0115949 A1* | 6/2006 | Zhang et al. | 438/300 |
| 2006/0128105 A1* | 6/2006 | Ouyang et al. | 438/300 |
| 2006/0134873 A1* | 6/2006 | Koontz | 438/301 |

OTHER PUBLICATIONS

"Strained Si NMOSFETs for High Performance CMOS Technology", K. Rim, S. Koester, M. Hargrove, J. Chu, P.M. Mooney, J Ott, T. Kanarsky, P. Ronsheim, M. Ieong, A. Grill and H.-S. P. Wong, 2001 Symposium on VLSI Technology Digest of Technical Papers, 2 pgs.

"Low Field Mobility Characteristics of Sub-100 nm Unstrained and Strained Si MOSFETs", K. Rim, S. Narasimha, M. Longstreet, A. Mocuta and J. Cai, 2002 IEEE, IEDM, pp. 43-46.

"A Logic Nanotechnology Featuring Strained-Silicon". Scott E. Thompson, Mark Armstrong, Chis Auth, Steve Cea, Robert Chau, Glenn Glass, Thomas Hoffman, Jason Klaus, Zhiyong Ma, Brian McIntyre, Anand Murthy, Borna Obradovic, Lucian Shifren, Sam Sivakumar, Sunit Tyagi, Tahir Ghani, Kaizad Mistry, Mark Bohr and Youssef El-Mansy, IEEE Electron Device Letters, vol. 25, No. 4, Apr. 2004, pp. 191-193.

* cited by examiner

DRIVE CURRENT IMPROVEMENT FROM RECESSED SIGE INCORPORATION CLOSE TO GATE

REFERENCE TO RELATED APPLICATION

This application claims priority to and the benefit of U.S. Provisional Patent Application Ser. No. 60/533,625, which was filed Dec. 31, 2003, entitled DRIVE CURRENT IMPROVEMENT FROM RECESSED-SiGe DRAIN EXTENSIONS ON PMOS, the entirety of which is hereby incorporated by reference.

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One way to increase the mobility of the carriers in the channel of an MOS transistor is to produce a mechanical stress in the channel.

A compressive strained channel has significant hole mobility enhancement over conventional devices. A tensile strained channel, such as a thin silicon channel layer grown on relaxed silicon-germanium, achieves significant electron mobility enhancement. The most common method of introducing tensile strain in a silicon channel region is to epitaxially grow the silicon channel layer on a relaxed silicon-germanium (SiGe), layer or substrate. The ability to form a relaxed SiGe layer is important in obtaining an overlying, epitaxially grown, silicon layer under biaxial tensile strain, however the attainment of the relaxed SiGe layer can be costly and difficult to achieve.

Another prior art method of obtaining a compressive strain in the channel is to epitaxially grow a SiGe layer over the entire active area. A disadvantage of this method is that germanium within the channel portion of the strain layer can migrate into the overlying gate oxide, thereby causing a relatively large interface trap density (DIT), which disadvantageously increases scattering and reduces the mobility advantages associated with the strained channel.

It would be advantageous to have a transistor device and method that effectively and reliably provides strain to the device in order to improve carrier mobility.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a device and method of fabrication, wherein a transistor device exhibits improved mobility due to the application of stress to the channel. The device has a stress application region formed in the semiconductor body near the channel region; consequently, less stress inducing species is needed to obtain the desired strain within the channel, thereby providing improved carrier mobility without a substantial number of threading dislocation defects.

The stress inducing regions in the semiconductor body are formed by selective epitaxial deposition of a silicon germanium material within recesses formed in the body. The recesses are formed in the body prior to the formation of sidewall spacers employed for source/drain implants. Consequently, the recesses are very close to the channel, and strain associated with the silicon germanium material therein is more effectively translated to the channel.

In accordance with one aspect of the present invention, a method of forming a transistor is provided, wherein a gate structure is formed over a semiconductor body, thereby defining a channel region therebelow. Recesses are formed in the body that are self-aligned with respect to the gate structure. In one example, such recesses are formed immediately after gate patterning or after formation of offset spacers (used for extension region implants) on lateral edges of the gate. The recesses are then filled with silicon germanium via a selective epitaxial deposition process. The silicon germanium material has a different lattice spacing than the silicon channel, thereby imparting a compressive strain to the channel region under the gate.

In one example, the silicon germanium material is doped with boron in-situ for the formation of p-type extension regions. In another example, an extension region implant is performed into the silicon germanium material after the selective epi deposition, followed by the formation of sidewall spacers and source/drain implants. Having the boron doped silicon germanium material (either doped in-situ or via implantation) close to the gate as opposed to laterally spaced away (e.g., at the source/drain locations) advantageously allows less germanium to be employed in the recesses for a given desired stress, thereby reducing threading dislocation defects.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
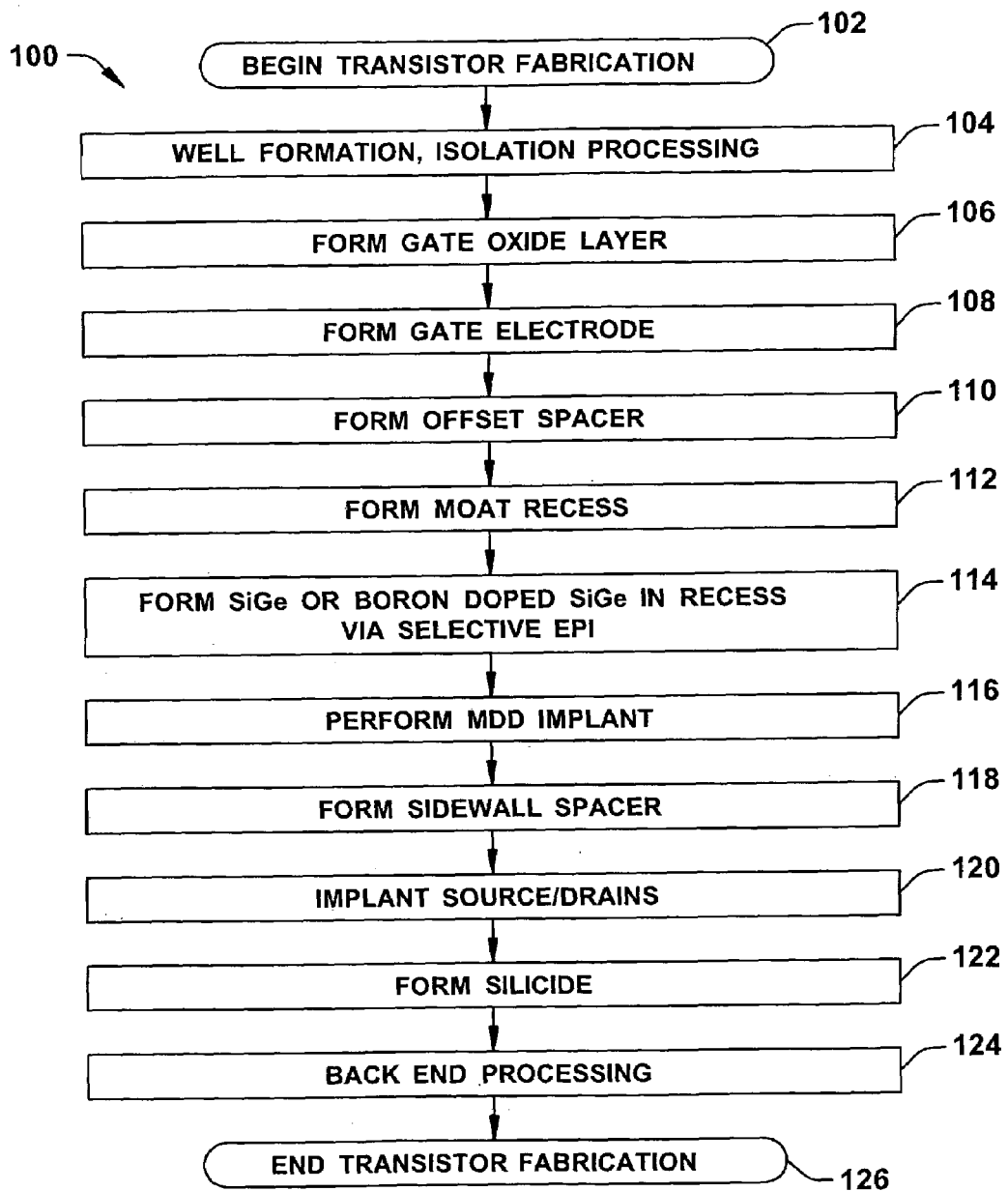
FIG. 1 is a flow chart illustrating a method of forming a transistor having improved mobility according to one aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while minimizing defects heretofore associated with conventional strained silicon device solutions.

Referring now to FIGS. 1 and 2A-2K, further aspects of the invention relate to methods of fabricating integrated circuits, wherein FIG. 1 illustrates an exemplary method 100 in accordance with the invention, and FIGS. 2A-2K illustrate the exemplary transistor device at various stages of fabrication in accordance with the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 100 begins at 102, wherein transistor fabrication is initiated, and transistor well formation and isolation processing is performed at 104. Act 104 thus defines NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (FOX) that serve to define various active areas and electrically isolate various active areas laterally from one another.

The method 100 continues at 106, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 108 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 110. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate. The offset spacer, as will be further appreciated below, is employed in this example to space away the strain inducing material slightly away from the channel region under the gate, for example, a distance of about 5 nm to about 20 nm. A recess is then formed in the moat area extending between the gate structure and the isolation regions at 112. The moat area refers to the active region of the silicon body where extension regions and subsequently source/drain regions may be formed. The recess is formed using, for example, a dry etching process such as the chemistry employed to etch STI trenches in the semiconductor body when forming isolation regions. The recesses, in one example extend into the semiconductor body to a depth of about 10-90 nm, and more preferably about 30-70 nm. In the present example, the gate structure is not masked during the recess formation; therefore if the gate electrode is composed of polysilicon, the recess formation process will also result in a recess formed in a top portion of the gate electrode material.

The method 100 then continues at 114, wherein silicon germanium is formed in the recesses. In one example, the silicon germanium is formed via a selective epitaxial deposition process such as an LPCVD (low pressure chemical vapor deposition) process using dichlorosilane and germane as the source gases. In one alternative of the present invention, the above reactants are employed to form SiGe in the recesses and subsequently the SiGe is subjected to a p-type implant to form a p-doped SiGe material (e.g., using Boron). Alternatively, and more preferably, the SiGe is doped in-situ during the selective epi deposition process by incorporating a p-type dopant reactant in the CVD process. For example, diborane or other type reactant may be employed, wherein a boron doped SiGe material is formed in the recesses (or other p-type dopant in the SiGe, as may be appreciated). The in-situ boron doping of the SiGe is preferred because it is believed that the in-situ doped boron is activated to a higher degree than when implanted into the SiGe, and therefore advantageously provides a lower extension region resistance.

While not intending to be limited to any one theory, it is believed that the silicon germanium within the recesses form an alloy that has a lattice with the same structure as the silicon body lattice, however, the silicon germanium has a larger spacing. Consequently, it is believed that the silicon germanium within the recesses will tend to expand, thereby creating a compressive stress within the channel of the semiconductor body underneath the channel.

If the SiGe material is not doped in-situ as discussed above, an extension region implant is then performed at 116, wherein dopants are introduced into the silicon germanium material in the recesses (both in the moat area as well as on a top portion of the gate electrode). For example, lightly doped, medium doped or heavily doped extension region implants are performed in the NMOS and PMOS regions, or alternatively, the NMOS regions and PMOS regions may be implanted separately with differing dopants by mask off each region, respectively. Since both the recesses (now filled with silicon germanium) and the extension region implants are formed after the offset spacer, both are self-aligned with respect to the offset spacer, thereby placing both regions extremely close to the lateral edge of the gate structure within the semiconductor body. A thermal process such as a rapid thermal anneal is then employed to activate the extension region dopants, which causes the extension regions to diffuse laterally slightly underneath the offset spacer toward the channels.

Still referring to FIG. 1, source/drain sidewall spacers are then formed on the gate structures at 118. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate structure at least about 60 nm. The source/drain regions are then formed by implantation at 120, wherein a source/drain dopant is introduced into the exposed areas (top of gate electrode and active areas not covered by sidewall spacers). The source/drain regions are then completed with a thermal process to activate the dopant.

The method 100 then concludes with silicide processing at 122, wherein a metal layer is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 124 to conclude the device formation at 126.

The method 100 of the present invention advantageously forms the silicon germanium extremely close to the channel region of the transistor device, only offset from the lateral edge of the gate structure about 5-20 nm. By residing closer to the channel, the SiGe more efficiently transfers the desired stress to the channel. Conventional solutions that employed germanium in the source/drain regions (formed after the wider sidewall spacers) resulted in germanium spaced substantially further away from the channel, for example, about 60 nm or more. Consequently, in order for conventional solutions to impart the same strain, substantially more volume of germanium is used, thereby increasing the number of threading dislocation defects. Further, for a given germanium content in the SiGe, for a 30 nm deep SiGe recess at the source/drain region, only about 250 MPa stress was provided to a middle of the channel, while the same SiGe recess depth at the extension region location was found to provide about 900 MPa. As can be seen, the recess location of the present invention provides for a substantial improvement in transistor performance.

In the present invention, therefore, substantially less germanium is needed to impart the desired compressive strain on the channel, thereby substantially reducing the number of threading dislocation defects and the performance degradation associated therewith. In accordance with the present invention, the amount of germanium in the recess comprises about ten (10) atomic percent to about twenty-five (25) atomic percent, wherein such a range of germanium results in a compressive strain in the channel of about 700 MPa to about 1.2 GPa. Consequently, the formation of the recesses prior to the sidewall spacer formation advantageously provides for substantially improved transistor performance by increasing the electron mobility while mitigating undue formation of threading dislocation defects. In addition, the presence of germanium near the channel serves to retard p-type dopant diffusion (e.g., for PMOS) and therefore helps to create a more abrupt extension region junction for PMOS devices. Another benefit of the present invention is that the p-type boron exhibits better activation with SiGe, which leads to a lower extension region resistance.

Figure 2A:
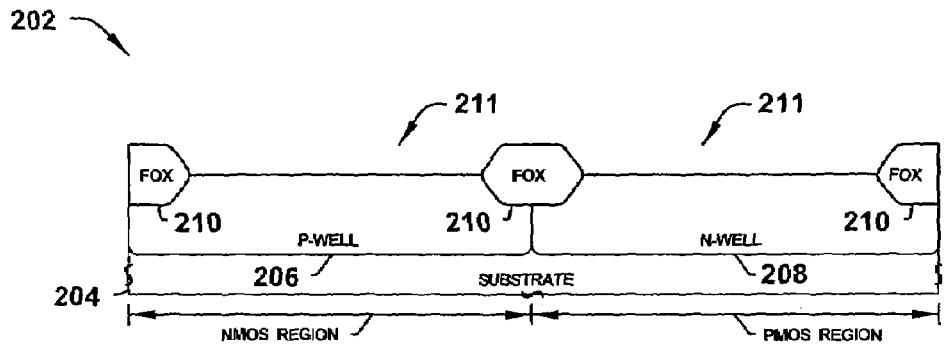
FIGS. 2A-2K are fragmentary cross section diagrams illustrating various steps of forming NMOS and PMOS transistors in accordance with the invention of FIG. 1.
Figure 2B:
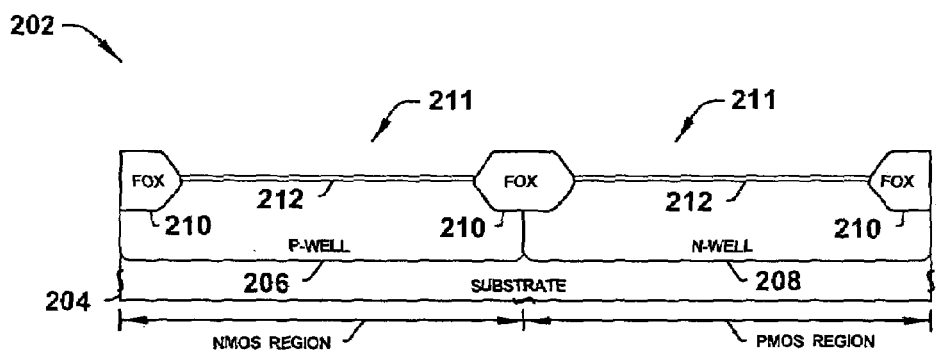

Turning now to FIGS. 2A-2K, a plurality of fragmentary cross section diagrams illustrating a transistor device being formed in accordance with the present invention of FIG. 1 is provided. In FIG. 2A, a transistor device 202 is provided, wherein a semiconductor body 204, such as a substrate, has a number of wells formed therein, such as a P-well 206 to define an NMOS transistor device region and an N-well 208 to define a PMOS transistor device region, respectively. Further, isolation regions 210 such as field oxide (FOX) or STI regions are formed in the semiconductor body to define active area regions 211, as may be appreciated. In FIG. 2B, the transistor device 202 is illustrated, wherein a gate dielectric 212 has been formed, for example, thermally grown $SiO_2$, over the active areas 211.

Figure 2C:
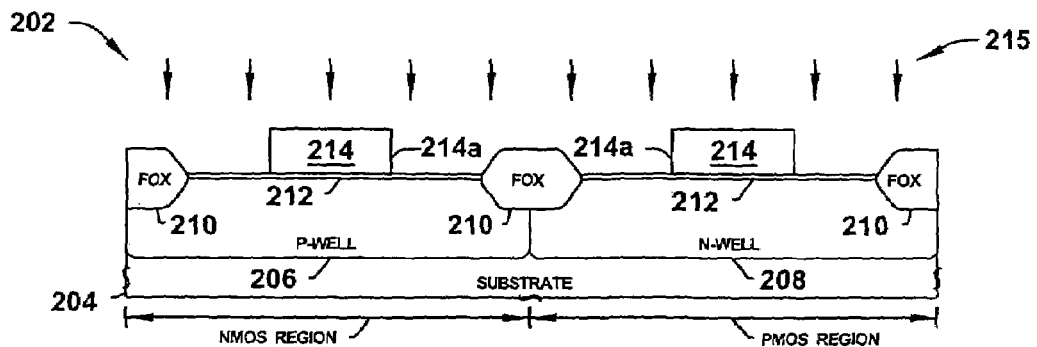
Figure 2D:
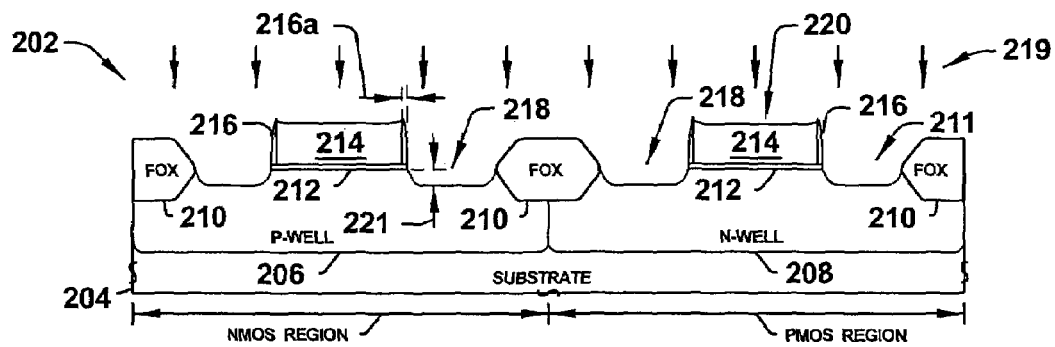

Referring to FIGS. 2C and 2D, a conductive gate electrode material (e.g., polysilicon) has been deposited and patterned via an etching process 215 to form a gate electrode 214 overlying the gate oxide 212. An offset spacer 216 is then formed on the lateral edges 214a of the gate electrode (FIG. 2D), wherein the offset spacers have a width 216a of about 10-50 nm. Recesses 218 are then formed in the active areas using an etch process 219, wherein the gate electrode 214 and isolations areas 210 serve as a mask. In the case where the gate electrode comprises polysilicon, the etch process 219 will also create a recess 220 in a top portion of the gate structures, as illustrated in FIG. 2D. The recesses 218 are formed into the semiconductor body to a depth 221 of about 10-90 nm, and more preferably about 30-70 nm, for example. Although the example illustrated herein has the recesses 218 formed after an offset spacer 216, such recesses may be formed prior to such a spacer, wherein in such instance the recesses 218 are aligned to the lateral edges 214a of the gate structures. In such instances, care should be taken to prevent a shorting of the gate to the subsequently formed epi by providing some type of isolation therebetween.

Figure 2E:
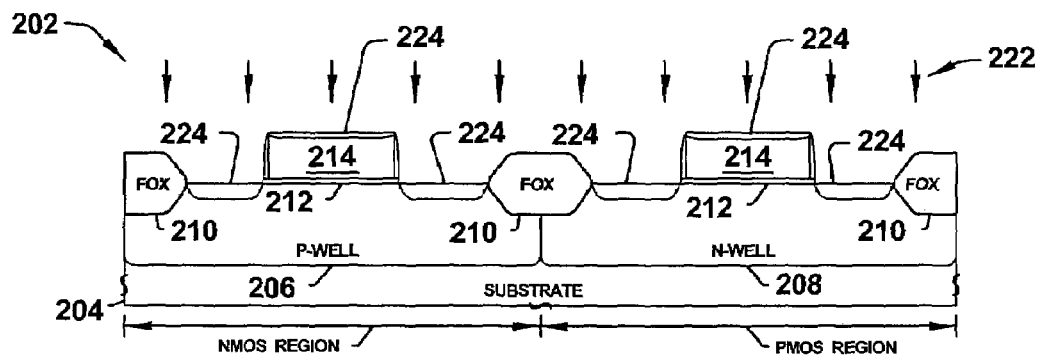

Turning now to FIG. 2E, a selective epitaxial deposition process 222 is provided, wherein a silicon germanium material 224 is formed on top of the gate electrode 214 (in the recess 220) and also in the recesses 218. As highlighted above, the process 222 may comprise an epitaxial deposition process, wherein a germanium containing source gas such as germane is added to the silane or dichlorosilane, such that a silicon germanium material is formed in the recesses. Further, in one example, the selective epi process further includes a diborane source gas to provide for the SiGe to be doped with boron in-situ. Alternatively, other p-type source gases may be employed, as may be appreciated.

Figure 2F:
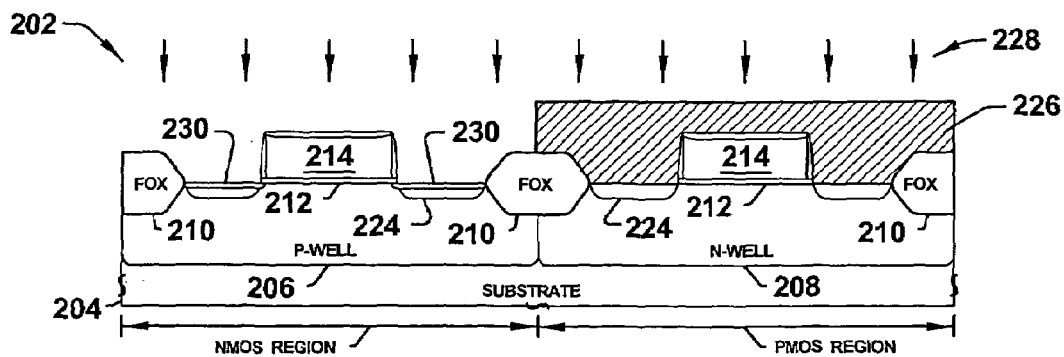

Alternatively, the SiGe material may be formed in the recesses 218, 220, and the SiGe is subsequently doped with a p-type dopant to form a p-type extension region in the PMOS region. In such case, the PMOS region is then masked off, as illustrated in FIG. 2F with a masking material 226 such as photoresist, and an extension region implant 228 is performed to form n-type extension regions 230 in the NMOS region. If the SiGe material is p-type doped in-situ, the n-type extension region can be made greater to offset such p-type dopant therein, as may be appreciated. A thermal process such as a rapid thermal anneal is then performed to activate the dopant, wherein a lateral diffusion of the extension regions 230 under the offset spacer 216 is achieved.

Figure 2G:
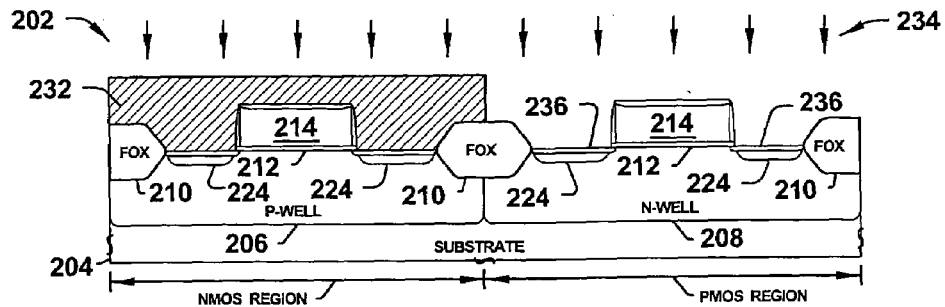

The p-type extension region mask 226 is then removed, and an n-type extension region mask 232 is deposited and patterned to cover the NMOS region, as illustrated in FIG. 2G. A p-type extension region implant process 234 is then performed to form p-type extension regions 236 in the PMOS region, as illustrated. As stated above, if the SiGe is formed with p-type doping in-situ, the p-type extension region masking and implant of FIG. 2G may be skipped.

Figure 2H:
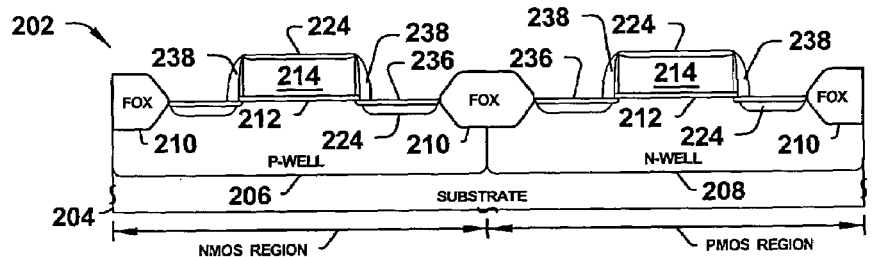

The mask 232 is then removed and source/drain sidewall spacers are formed over the offset spacers 216 on the lateral edges of the gate structures. An insulating sidewall material is deposited in a generally conformal manner over the device and subsequently subjected to an anisotropic etch to remove the insulating material on top of the gate and over the active areas, leaving sidewall spacers 238 in both the NMOS and PMOS regions, as illustrated in FIG. 2H.

Figure 2I:
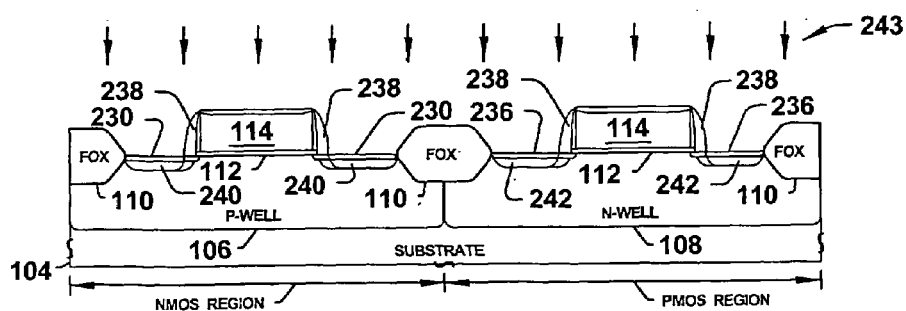

Source and drain regions 240 and 242 are formed in the NMOS and PMOS regions, respectively. As discussed above in conjunction with the extension region implants, the source/drain implants 243 are performed with an NSD mask (not shown) and then a PSD mask (not shown) in order to implant the NMOS region and the PMOS region separately with n-type and p-type dopant, respectively. As can be seen in FIG. 2I, the source/drain regions 240, 242 are self-aligned with respect to the sidewall spacers, and thus are laterally spaced from the extension regions 230, 236 and the SiGe strain regions 224 nearest the channel (underlying the gate 214).

Figure 2J:
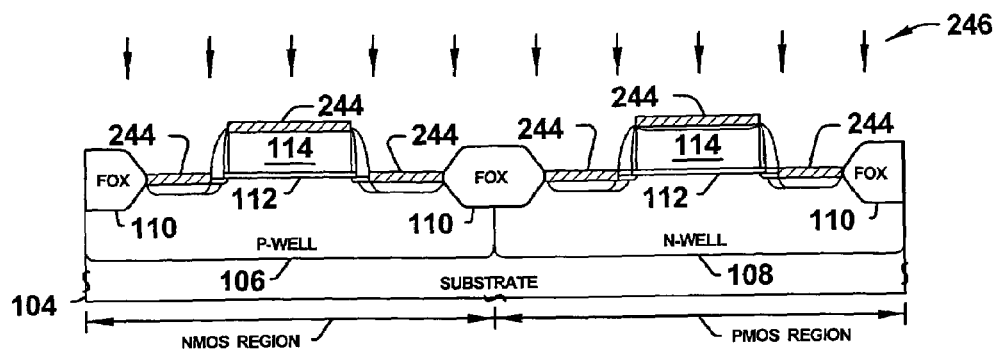

The method then concludes with silicidation, wherein a metal layer is deposited, for example, via sputtering, over the device, followed by a thermal process 246. During the thermal processing, those regions where the metal contacts silicon reacts to form a metal silicide, as illustrated in FIG. 2J. More particularly, the silicide 244 forms on the source/drain regions and on top of the gates as illustrated. Subsequently, back end processing including metallization may be performed to interconnect the various transistors, as may be desired.

Figure 2K:
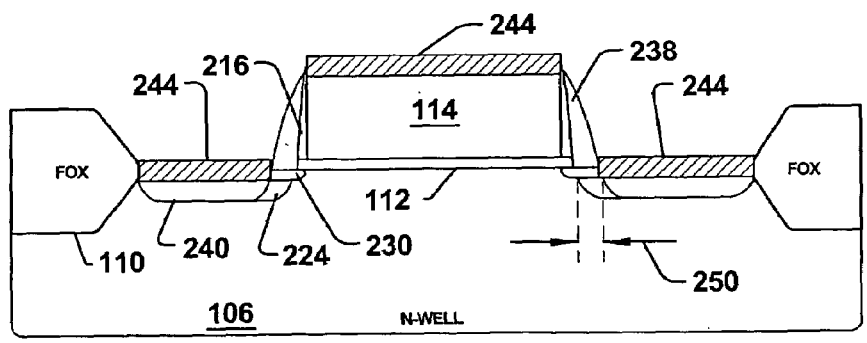

Looking now at FIG. 2K, an enlarged view of the resulting PMOS transistor fabricated in accordance with the invention of FIG. 1 is illustrated. Note that the silicon germanium stress inducing region 224 is substantially closer to the channel than the source/drain regions 240, for example, by a distance 250. Having the silicon germanium region 224 substantially closer to the channel provides for a substantial improvement over the prior art in that substantially less germanium is needed to impart the desired compressive stress to the channel. Consequently, with less germanium needed, few threading dislocation defects are generated, thereby resulting in substantial performance improvements over the prior art, for example, reduced leakage. In addition, in the instance where the SiGe material is doped in-situ with boron, it was found that the extension region resistance was decreased. Accordingly, with an approximate 35% PMOS device improvement, it was estimated that about 28% of the improvement is from improved stress, while about 7% is due to the extension region resistance improvement.

Figure 3:
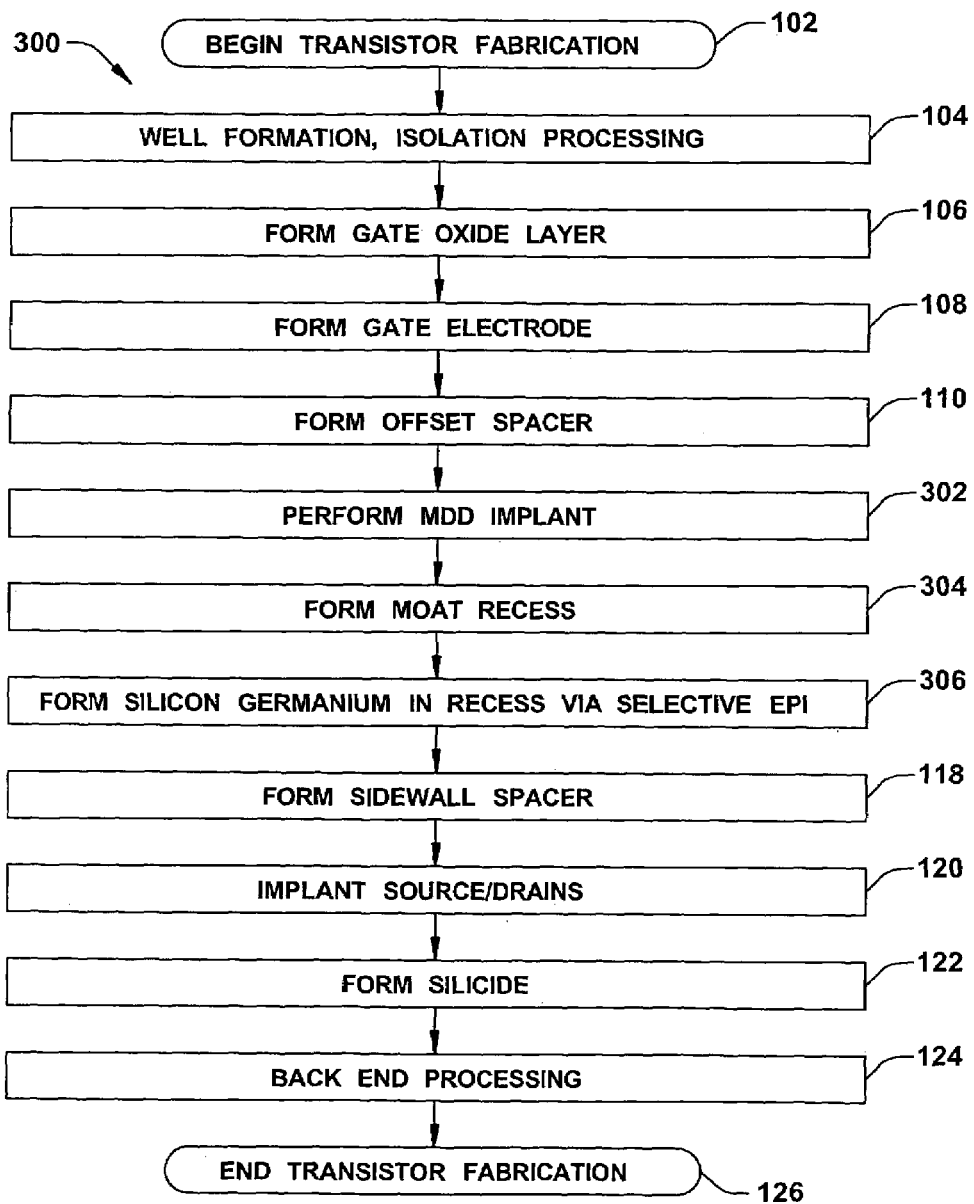
FIG. 3 is a flow chart diagram illustrating a method of forming a transistor having improved mobility according to another aspect of the present invention.

In accordance with another aspect of the invention, FIG. 3 is a flow chart directed to another method of forming a transistor device having improved mobility due to an efficient application of compressive stress to the channel, and is designated at reference numeral 300. The method 300 is similar in many respects to the method 100 of FIG. 1, and with regards to such aspects, those portions will not be repeated again. For example, acts 102-110 may proceed generally in the same manner as method 100. At 302, an extension region implant and anneal is performed after the offset spacer has been formed on lateral edges of the gate structure. Recesses are then formed in the active area (and also on top of the gate) at 304 after the extension regions have been formed in the extension region. A silicon germanium material is then formed in the recesses at 306 to form a strain-inducing region near the channel. The method 300 may then proceed at 118-126 in a manner similar to that of method 100. Consequently, the method 300 indicates that the order in which the extension regions are formed and the recesses are formed may be switched, and either alternative is contemplated as falling within the scope of the present invention.

Figure 4A:
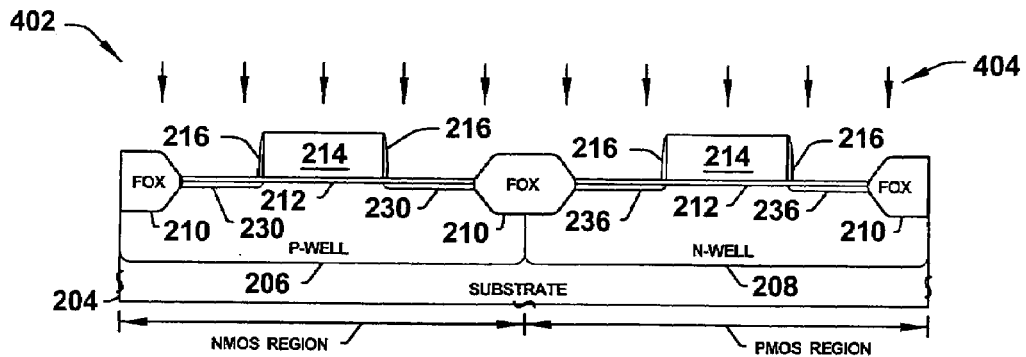
FIGS. 4A-4F are fragmentary cross section diagrams illustrating various steps of forming NMOS and PMOS transistors in accordance with the invention of FIG. 3.

FIGS. 4A-4F illustrate the fabrication of the transistor devices in accordance with the method 300 of FIG. 3. As illustrated in FIG. 4A, a transistor device has NMOS and PMOS regions as before with P-well and N-well regions 206 and 208 formed in a semiconductor body 204. Isolation regions 210 also are provided to define active areas for fabrication of transistor devices. A gate oxide 212 overlies the active regions and a patterned conductive gate electrode 214 is formed thereover. Offset spacers 216 reside on lateral edges of the gate 214 and an extension region implant process 404 (e.g., an n-type followed by a p-type) is provided in conjunction with appropriate masking (not shown) to form extension regions 230 and 236, respectively. A subsequent thermal anneal causes the extension regions 230 and 236 to diffuse laterally and extend slightly under the offset spacers 216.

Figure 4B:
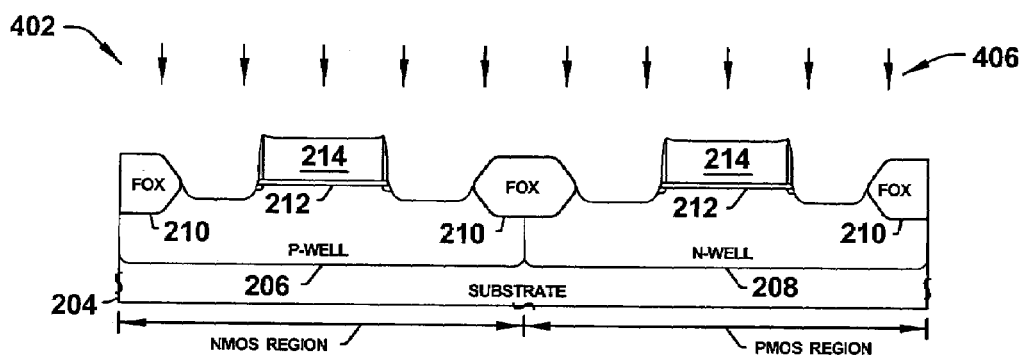
Figure 4C:
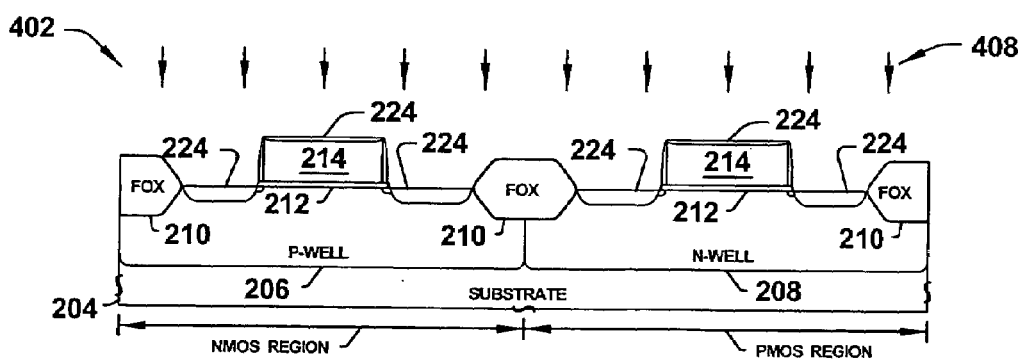

Recesses 406 are then formed in the active areas (and on top of the gate electrodes 214) after the extension region implant via an etch process 406, as illustrated in FIG. 4B. Because the extension regions have diffused slightly under the offset spacers 216 and the recesses are self-aligned with respect to the spacers, small portions of the extension regions remain near the channel, as illustrated. A silicon germanium material 224 is then formed in the recesses and on top of the gate electrode as illustrated in FIG. 4C, via a selective epitaxial deposition process 408. As discussed supra, this SiGe material may also be boron doped in-situ.

Figure 4D:
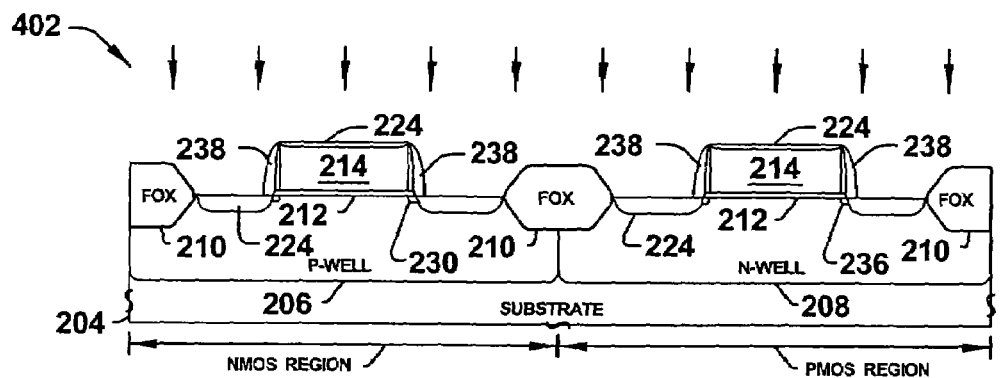
Figure 4E:
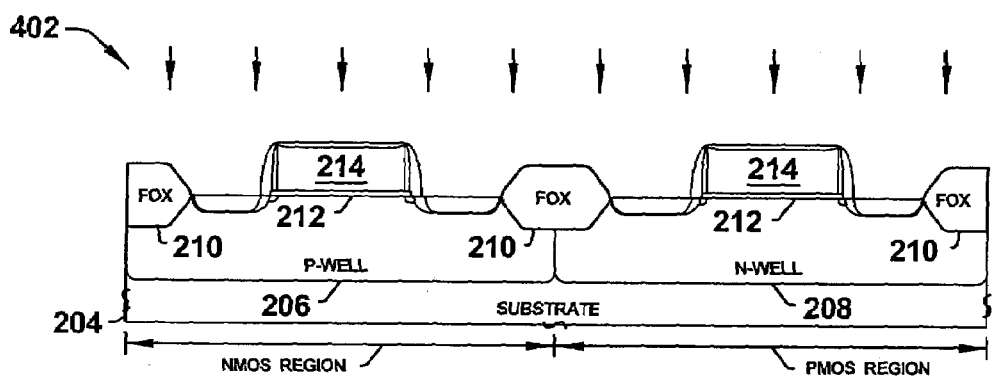
Figure 4F:
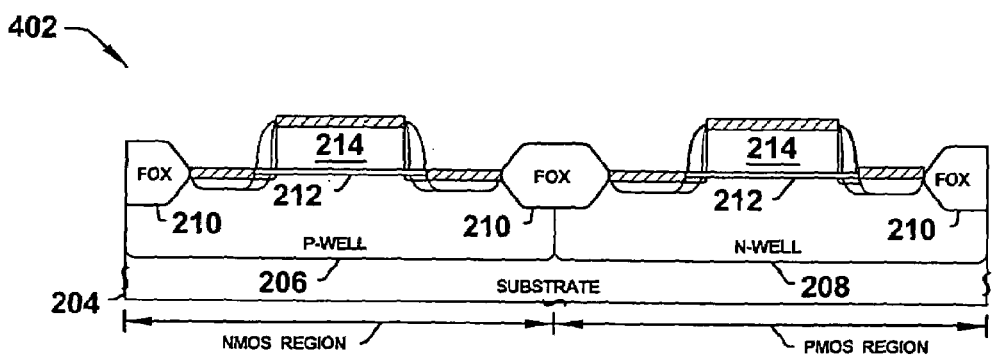

FIGS. 4D-4F progress similarly to that described in the previous method, wherein sidewall spacers are formed, followed by the source/drain implants (in NMOS regions and then PMOS regions, respectively with appropriate masking not shown) and then silicidation. Note that after the source/drain implants, a thermal process is employed to activate the dopants, which causes some lateral diffusion thereof, thereby causing the source/drain regions to connect with the respective extension regions.

In the methods of FIGS. 1 and 3, the recesses and a SiGe selective epitaxial process is performed in both the NMOS and the PMOS regions. The inventors of the present invention discovered that although the compressive stress provided by the SiGe effectively improves hole mobility substantially for PMOS performance improvement, that the presence of germanium in the NMOS regions may, in some instances, have a substantial deleterious impact on electron mobility in the NMOS regions. Accordingly, the present invention contemplates another alternative aspect of the present invention, wherein the recesses and filling thereof with boron doped silicon germanium material may be performed solely in the PMOS regions of the device, as will be discussed below and illustrated in conjunction with FIGS. 5 and 6A-6G.

Figure 5:
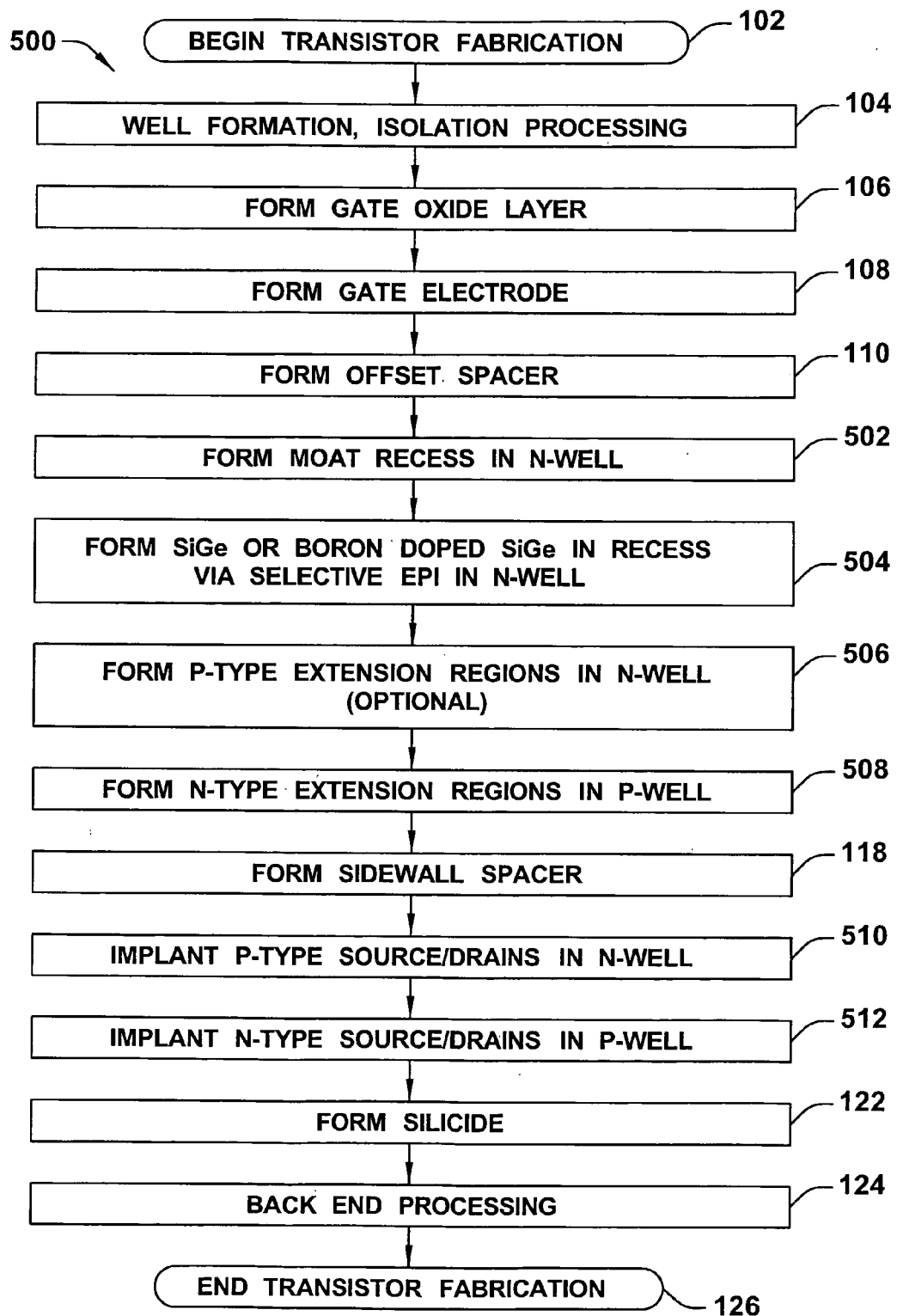
FIG. 5 is a flow chart diagram illustrating a method of forming a transistor having improved mobility according to yet another aspect of the present invention.

Turning now to FIG. 5, a method 500 is disclosed wherein a PMOS transistor is formed in a CMOS process that exhibits improved carrier mobility due to a compressive stress applied to the channel. Acts 102-110 may proceed in a manner similar to that discussed supra. At 502, a moat recess is selectively formed in an N-well (a PMOS region) by masking off the P-well (the NMOS region) and performing a silicon etch after the formation of offset spacers on the sidewalls of the gate electrodes. Boron or other p-type doped silicon germanium is then formed in the recesses (in the active areas as well as on top of the gate electrode) via a selective epi deposition process in the PMOS region at 504 while the mask is maintained on the NMOS region, thereby preventing such material to form therein.

If the SiGe is not p-doped during selective epi deposition, p-type extension regions are then formed at 506 with the mask still in place, thereby doping the silicon germanium material within the recesses with p-type dopants, if desired. A thermal process then causes the p-type dopant to diffuse laterally under the offset spacers, and toward the channel. Alternatively, the p-type extension regions may be formed prior to forming the recesses.

The method 500 continues at 508 by removing the mask in the NMOS region, depositing and patterning another mask over the PMOS region, and performing an n-type extension region implant into the P-well in the NMOS region to form n-type extension regions that are self-aligned with respect to the offset spacers. The mask is then removed and sidewall spacers are formed at 118 over the offset spacers in both the NMOS and PMOS regions.

Another mask is deposited and patterned to cover the NMOS region and a p-type source/drain implant is performed 510 therein to form p-type source/drain regions that are self-aligned with respect to the sidewall spacers. The mask is then removed and a second mask is provided to cover the PMOS regions, and an n-type source/drain implant is performed at 512 in the NMOS regions to form n-type source/drain regions therein that are self-aligned with respect to the sidewall spacers. Silicide processing 122 and back end processing 124 may then proceed in a typical manner.

Figure 6A:
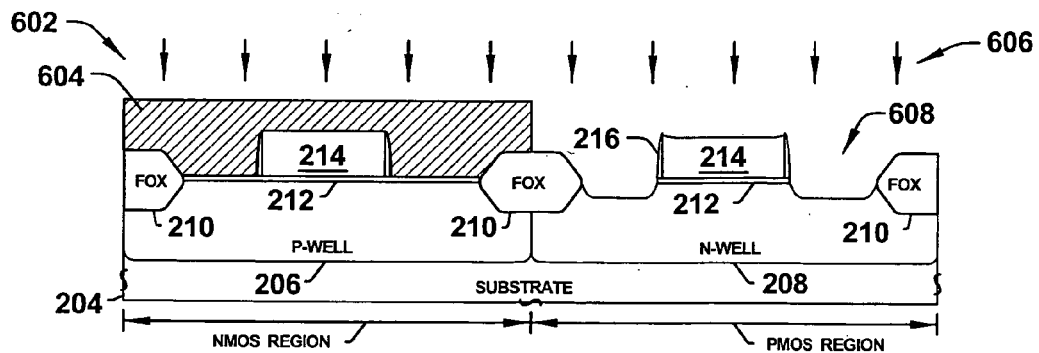
FIGS. 6A-6G are fragmentary cross section diagrams illustrating various steps of forming an NMOS transistor in accordance with the invention of FIG. 5.
Figure 6B:
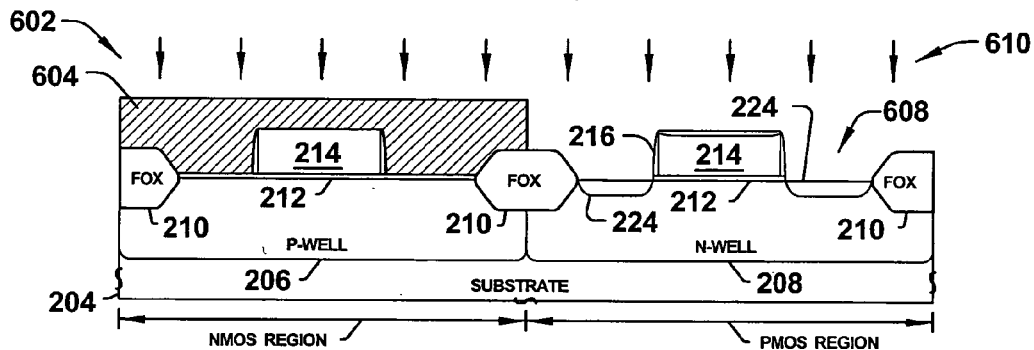
Figure 6C:
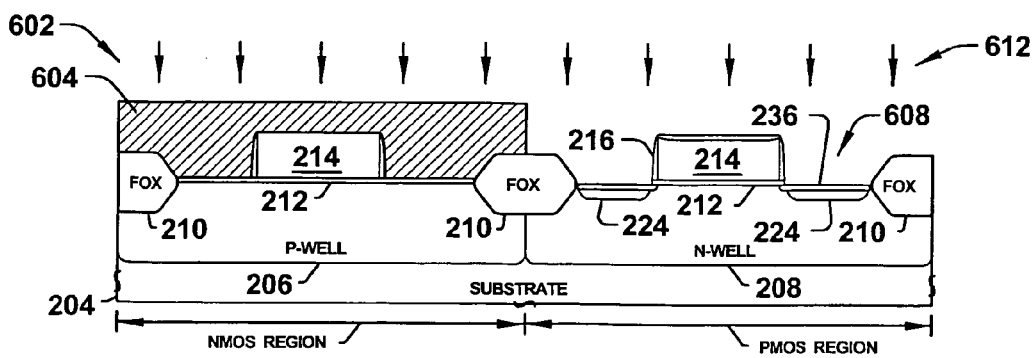

In FIG. 6A, the device 602 is illustrated with a mask 604 over the NMOS region, and an etch process 606 is performed to form the recesses 608 in the active areas defined by the offset spacers 216 and the isolation regions 210, as well as on top of the gate electrode 214 (when the gate comprises polysilicon). In FIG. 6B, a selective epitaxial deposition process 610 is performed, wherein a silicon germanium material 224 is formed in the recesses 608 while the mask 604 continues to mask the NMOS region. In one example, the selective epi process 610 further includes a p-type dopant such as boron, wherein the resultant material comprises boron doped silicon germanium 224. Alternatively, the PMOS region is then subjected to a p-type extension region implant 612, wherein the p-type extension regions 236 are formed (FIG. 6C) into the SiGe material 224. A subsequent thermal anneal causes the extension regions to diffuse laterally slightly under the offset spacers.

Figure 6D:
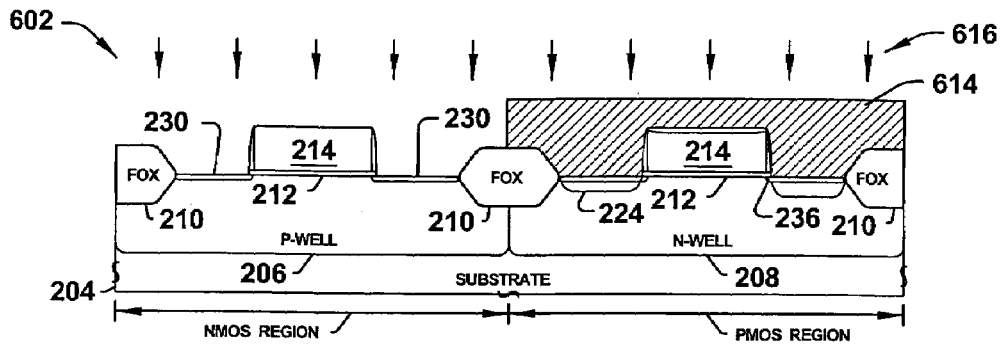
Figure 6E:
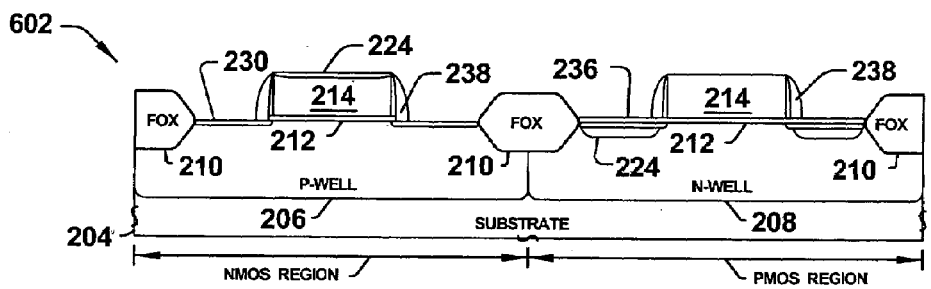
Figure 6F:
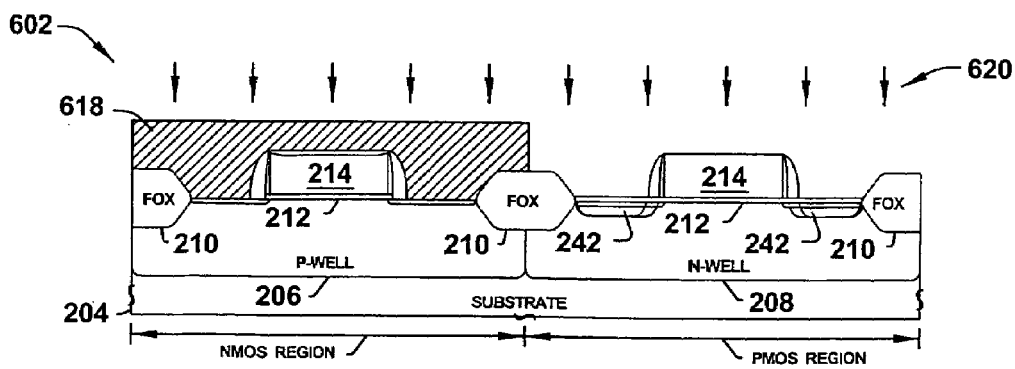
Figure 6G:
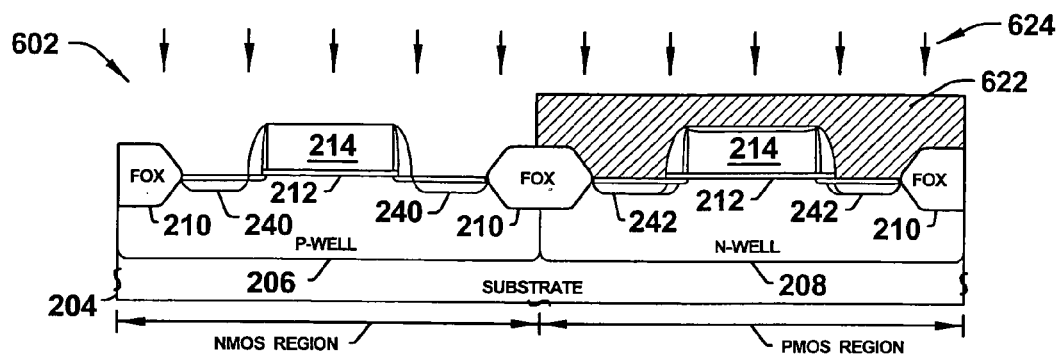

The mask 604 is then removed, and another mask 614 is formed and patterned to overlie the PMOS region, as illustrated in FIG. 6D. An n-type extension region implant 616 is then performed to form n-type extension regions 230 in the NMOS region as shown. The mask 614 is then removed and sidewall spacers 238 are formed over the offset spacers in both the NMOS and PMOS regions, as illustrated in FIG. 6E. Another mask 618 is then formed over the NMOS region (FIG. 6F), and a p-type source/drain implant 620 is performed in the PMOS region to form the source/drain regions 242. The mask 618 is then stripped, and another mask 622 is formed to cover the PMOS region, and an n-type source/drain implant process 624 is provided to form n-type source/drain regions 240, as illustrated in FIG. 6G.

In the above manner, the device may be fabricated with optimized PMOS transistors without any strain applied to the channel in NMOS devices.

In addition, while the invention is described above with respect to the use of germanium to form a silicon germanium lattice structure, the present invention contemplates the use of any element that will create an alloy with silicon and serve to impart a compressive stress to the channel of the PMOS devices, and such alternatives are contemplated as falling within the scope of the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a transistor, comprising:
  forming a gate structure over an n-type semiconductor body;
  forming offset spacers on the lateral edges of the gate structure;
  performing a p-type extension region implant after formation of the offset spacers;
  performing a thermal process after the extension region implant, wherein the extension regions slightly diffuse laterally in response thereto such that edges thereof extend below the offset spacers toward the gate structure;
  forming recesses substantially aligned to the gate structure in the semiconductor body after performing the thermal process, wherein the recesses are aligned in the semiconductor body with respect to the offset spacers;
  epitaxially growing silicon germanium in the recesses;
  forming sidewall spacers over lateral edges of the gate structure after growing the silicon germanium in the recesses; and
  implanting p-type source and drain regions in the semiconductor body after forming the sidewall spacers.

2. The method of claim 1, further comprising forming offset spacers on the lateral edges of the gate structure before forming the recesses, wherein the recesses are aligned in the semiconductor body with respect to the offset spacers.

3. The method of claim 2, wherein the recesses are offset from the lateral edges of the gate structure a distance of about 5 nm or more and about 20 nm or less.

4. The method of claim 1, wherein epitaxially growing the silicon germanium comprises performing a selective epitaxial deposition of silicon germanium in the presence of a p-type dopant containing source gas, wherein the p-type dopant dopes the epitaxially growing silicon germanium in-situ.

5. The method of claim 2, further comprising implanting p-type extension regions into the silicon germanium before forming the sidewall spacers.

6. The method of claim 1, wherein forming the gate structure comprises: forming a gate oxide over the semiconductor body; and depositing and patterning a conductive layer to form a gate electrode over the gate oxide, thereby defining the gate structure.

7. The method of claim 1, wherein the silicon germanium in the recesses contains about 10 atomic percent germanium or more and about 25 atomic percent germanium or less.

8. The method of claim 1, wherein the recesses have a depth of about 10 nm or more and about 90 nm or less.

9. The method of claim 1, further comprising performing a thermal process after implanting the source and drain regions, wherein the source and drain regions diffuse laterally due to the thermal process, thereby connecting to the respective extension regions under the sidewall spacers.

10. The method of claim 1, further comprising forming a recess in a top portion of the gate structure concurrently with the forming of the recesses.

11. The method of claim 10, further comprising epitaxially growing silicon germanium in the recess in the top portion of the gate structure concurrently with the formation of the silicon germanium in the recesses associated with the semiconductor body.

12. A method of forming an NMOS and a PMOS transistor concurrently, comprising:
   forming gate structure over a semiconductor body in an NMOS region and a PMOS region, respectively;
   forming offset spacers on the lateral edges of the gate structures;
   performing an n-type extension region implant in the NMOS region and a p-type extension region implant in the PMOS region, respectively, after formation of the offset spacers;
   performing a thermal process after the extension region implant, wherein the extension regions slightly diffuse laterally in response thereto such that edges thereof extend below the offset spacers toward the respective gate structures;
   forming recesses substantially aligned to the gate structures in the semiconductor body in both the NMOS and PMOS regions after performing the thermal process, wherein the recesses are aligned in the semiconductor body with respect to the offset spacers;
   epitaxially growing silicon germanium in the recesses;
   forming sidewall spacers over lateral edges of the gate structures after growing the silicon germanium in the recesses; and
   implanting n-type source and drain regions in the NMOS region and p-type source and drain regions in the PMOS region of the semiconductor body after forming the sidewall spacers.

13. The method of claim 12, further comprising forming offset spacers on the lateral edges of the gate structures before forming the recesses, wherein the recesses are aligned in the semiconductor body with respect to the offset spacers.

14. The method of claim 13, wherein the recesses are offset from the lateral edges of the gate structure a distance of about 5 nm or more and about 20 nm or less.

15. The method of claim 13, further comprising implanting n-type extension regions in the NMOS region and p-type extension regions in the PMOS region into the silicon germanium before forming the sidewall spacers.

16. The method of claim 12, wherein the silicon germanium in the recesses contains about 10 atomic percent germanium or more and about 25 percent atomic germanium or less.

17. The method of claim 12, wherein the recesses have a depth of about 10 nm or more and about 90 nm or less.

18. The method of claim 12, further comprising performing a thermal process after implanting the n-type source and drain regions in the NMOS region and the p-type source and drain regions in the PMOS region, respectively, wherein the n-type and p-type source and drain regions diffuse laterally due to the thermal process, thereby connecting to the respective extension regions under the sidewall spacers.

19. The method of claim 12, further comprising forming a recess in a top portion of the gate structures concurrently with the forming of the recesses.

20. The method of claim 19, further comprising epitaxially growing silicon germanium in the recess in the top portion of the gate structures concurrently with the formation of the silicon germanium in the recesses associated with the semiconductor body.

* * * * *